United States Patent
Takanaka (10) Patent No.: US 11,905,490 B2
(45) Date of Patent: Feb. 20, 2024

(54) CLEANING LIQUID COMPOSITION

(71) Applicant: Kanto Kagaku Kabushiki Kaisha, Tokyo (JP)

(72) Inventor: Areji Takanaka, Saitama (JP)

(73) Assignee: Kanto Kagaku Kabushiki Kaisha, Tokyo (JP)

(*) Notice: Subject to any disclaimer, the term of this patent is extended or adjusted under 35 U.S.C. 154(b) by 310 days.

(21) Appl. No.: 17/275,629

(22) PCT Filed: Sep. 19, 2019

(86) PCT No.: PCT/JP2019/036709
§ 371 (c)(1),
(2) Date: Mar. 11, 2021

(87) PCT Pub. No.: WO2020/059782
PCT Pub. Date: Mar. 26, 2020

(65) Prior Publication Data
US 2022/0033744 A1    Feb. 3, 2022

(30) Foreign Application Priority Data
Sep. 20, 2018  (JP) ................. 2018-176376

(51) Int. Cl.
*C11D 3/37*       (2006.01)
*C11D 11/00*      (2006.01)
(Continued)

(52) U.S. Cl.
CPC ............ *C11D 11/0047* (2013.01); *C11D 1/16* (2013.01); *C11D 7/08* (2013.01); *C11D 7/261* (2013.01);
(Continued)

(58) Field of Classification Search
CPC .................................................. C11D 11/0047
(Continued)

(56) References Cited
U.S. PATENT DOCUMENTS

| | | |
|---|---|---|
| 2004/0142835 A1 | 7/2004 | Takashima |
| 2011/0136717 A1 | 6/2011 | Tamboli et al. |

(Continued)

FOREIGN PATENT DOCUMENTS

| | | |
|---|---|---|
| JP | 2005101479 | 4/2005 |
| JP | 2015-165562 | 9/2015 |

(Continued)

OTHER PUBLICATIONS

European Search Report issued for European Patent Application No. 19861841.5; dated Apr. 25, 2022 (pp. 1-14).

(Continued)

*Primary Examiner* — Gregory E Webb
(74) *Attorney, Agent, or Firm* — McDonnell Boehnen Hulbert & Berghoff LLP (57) ABSTRACT

An object of the present invention is to provide a cleaning liquid that effectively removes in a short time organic residues and abrasive grains derived from a slurry in a semiconductor substrate in which a Co contact plug and/or Co wiring are present.

The present invention relates to a cleaning liquid composition for cleaning a substrate having a Co contact plug and/or Co wiring, which contains one or more reducing agents and water. Furthermore, the present invention relates to a cleaning liquid composition for cleaning a substrate having Co and not having Cu, which contains one or more reducing agents and water and has a pH of 3 or more and less than 12.

7 Claims, 3 Drawing Sheets

(51) Int. Cl.
*C11D 1/16* (2006.01)
*C11D 7/08* (2006.01)
*C11D 7/26* (2006.01)
*C11D 7/32* (2006.01)
*C11D 7/50* (2006.01)
*H01L 21/02* (2006.01)

(52) U.S. Cl.
CPC .............. *C11D 7/266* (2013.01); *C11D 7/267* (2013.01); *C11D 7/3209* (2013.01); *C11D 7/50* (2013.01); *H01L 21/02068* (2013.01)

(58) Field of Classification Search
USPC ........................................................ 510/175
See application file for complete search history.

(56) References Cited

U.S. PATENT DOCUMENTS

| | | |
|---|---|---|
| 2016/0083675 A1 | 3/2016 | Morita et al. |
| 2016/0272924 A1 | 9/2016 | Kajikawa et al. |
| 2018/0355212 A1 | 12/2018 | Nojima et al. |
| 2019/0177669 A1 | 6/2019 | Kamimura et al. |
| 2020/0002652 A1 * | 1/2020 | Kusano ................ C11D 7/3218 |
| 2021/0130739 A1 | 5/2021 | Kayakubo et al. |

FOREIGN PATENT DOCUMENTS

| | | | |
|---|---|---|---|
| JP | 2015165561 | 9/2015 | |
| JP | 2018-26461 | 2/2018 | |
| TW | AA-201013336 | 4/2010 | |
| TW | AA-201506152 | 2/2015 | |
| WO | 2006/081406 A1 | 1/2006 | |
| WO | WO-2006025373 A1 * | 3/2006 | ............... C11D 1/04 |
| WO | 2006/127885 A1 | 5/2006 | |
| WO | WO 2010008877 A1 | 1/2010 | |
| WO | 2013/142250 | 3/2013 | |
| WO | 2013/173743 A1 | 5/2013 | |

OTHER PUBLICATIONS

Office Action in corresponding Chinese Application No. 201980054513.1 dated Dec. 2, 2022.
Office Action for TW 108133961 dated May 23, 2023. (English language translation attached).
Office Action issued in corresponding Chinese patent application No. 201980054513.1, dated Jul. 7, 2023.

* cited by examiner

CLEANING LIQUID COMPOSITION

This application is a U.S. National Phase application under 35 U.S.C. § 371 of PCT/JP2019/036709, filed Sep. 19, 2010, which claims priority from and the benefit of Japanese Application No.: 2018-0176376, filed on Sep. 20, 2018, the specifications of which are hereby incorporated by reference in their entireties into the instant application.

TECHNICAL FIELD

The present invention relates to a cleaning liquid composition used for cleaning a substrate having Co.

BACKGROUND ART

In recent years, with the progress of miniaturization and multi-layer wiring structure of devices, more precise flattening of the substrate surface is required in each process; and chemical mechanical polishing (CMP) technology has been introduced as a new technology to semiconductor substrate manufacturing processes, wherein wafers are crimped to polishing cloth called a buff and rotated while supplying a mixture slurry of polishing particles and chemicals, thereby combining chemical action and physical action to polish and flatten insulating films and metal materials.

Conventionally, tungsten (W) has been used for contact plugs for pulling an electrode such as gate, source, and drain of a transistor onto an insulating film; however, with miniaturization, cobalt (Co) has come to be used as a material with lower electrical resistance than W in advanced devices.

Furthermore, wiring (middle of line: MOL) that electrically connects these contact plugs and the wiring in the upper layer is also shifting from copper (Cu) to Co with miniaturization.

In this process of forming devices, as in the conventional cases, CMP is carried out using slurry in which alumina and silicon compound such as silicon oxide and/or cerium compound such as cerium oxide are used as abrasive grains.

The surface of a substrate after CMP is contaminated with particles typified by alumina, silica or cerium oxide particles contained in the slurry, and metal impurities derived from constituent substances on the surface to be polished and from chemicals contained in the slurry. Since these contaminants cause pattern defects, poor adhesion, and poor electrical characteristics, etc., they must be completely removed before entering the next step. As a general post-CMP cleaning for removing these contaminants, brush cleaning is performed in which chemical action of cleaning liquid and physical action of sponge brush made from polyvinyl alcohol, etc. are combined.

To date, Co has been used as a barrier metal for preventing metal diffusion in Cu wiring in semiconductor manufacturing processes, and cleaning liquids for Cu and Co have been proposed (Patent Documents 1 to 4). However, it is considered to be difficult to use these cleaning liquids for contact plugs and MOLs that use Co.

This is because Co used as a barrier metal or liner is very thin, and it is considered that foreign substances called organic residues derived from slurry and abrasive grains are unlikely to remain on Co; whereas the area of Co in contact plugs and MOLs is larger than that in liners, and organic residues and abrasive grains remain easily, and therefore, it is difficult to say that the use of cleaning liquids that can be used for barrier metals and liners that use Co is appropriate, and in fact, it has turned out to be true. Therefore, a cleaning liquid corresponding to Co contact plugs and wiring using Co (hereinafter referred to as Co wiring) is considered to be required, but such a cleaning liquid has not yet been proposed.

CITATION LIST

Patent Document

[Patent Document 1] JP A No. 2008-528762
[Patent Document 2] JP A No. 2008-543060
[Patent Document 3] JP A No. 2015-519723
[Patent Document 4] JP A No. 2015-524165

SUMMARY OF INVENTION

Problems to be Solved by Invention

Therefore, an object of the present invention is to provide a cleaning liquid that effectively removes in a short time organic residues and abrasive grains derived from slurry in a semiconductor substrate in which a Co contact plug and Co wiring are present. In particular, it is an object of the present invention to provide a cleaning liquid that effectively removes organic residues.

Means for Solving Problems

In earnest research to solve the above problems, the present inventors have found that a cleaning liquid composition containing one or more reducing agents and water can effectively remove in a short time organic residues and abrasive grains derived from slurry containing Co, by acting on the organic residue that is a polymer in which Co ions generated by CMP and a preservative contained in the slurry are complexly bound, and changing the valence of Co ions, thereby weakening the chemical bond that forms the polymer. As a result of further research, the present inventors have completed the present invention.

Namely, the present invention relates to the following.

[1] A cleaning liquid composition for cleaning a substrate having a Co contact plug and/or Co wiring, containing one or more reducing agents and water.

[2] A cleaning liquid composition for cleaning a substrate having Co and not having Cu, which contains one or more reducing agents and water and has a pH of 3 or more and less than 12.

[3] The cleaning liquid composition according to [2], wherein the substrate has a Co contact plug and/or Co wiring.

[4] The cleaning liquid composition according to any one of [1] to [3], wherein the reducing agent contains one or more selected from the group consisting of five-membered ring or six-membered ring compounds in which two or more hydroxyl groups are directly bonded to the ring.

[5] The cleaning liquid composition according to [4], wherein the reducing agent is one or more selected from the group consisting of ascorbic acid, pyrogallol and methyl gallate.

[6] The cleaning liquid composition according to any one of [1] to [5], further containing one or more polysulfonic acid compounds as a surfactant.

[7] A stock solution composition for the cleaning liquid composition according to any one of [1] to [6], which is used to obtain the cleaning liquid composition by 10 times to 1000 times dilution.

[8] A method for manufacturing a semiconductor substrate, comprising a step of bringing the cleaning liquid composition according to any one of [1] to [6] into contact with the substrate having a Co contact plug and/or Co wiring.

[9] The method for manufacturing a semiconductor substrate according to [8], comprising a step of chemical mechanical polishing (CMP) of the substrate having a Co contact plug and/or Co wiring, before the step of bringing the cleaning liquid composition into contact with the substrate having a Co contact plug and/or Co wiring.

[10] The method for manufacturing a semiconductor substrate according to [8] or [9], wherein the step of bringing the cleaning liquid composition into contact with the substrate having a Co contact plug and/or Co wiring is a step of cleaning the substrate having a Co contact plug and/or Co wiring.

Advantageous Effects of Invention

In a manufacturing process of electronic devices such as semiconductor elements, in cleaning the surface of a metal material of a substrate which has been subjected to polishing treatment, etching treatment, chemical mechanical polishing (CMP) treatment, etc., the cleaning liquid composition of the present invention can effectively remove in a short time metal impurities and fine particles, in particular organic residues containing Co which are reaction products of Co and an organic corrosion inhibitor, and abrasive grains. In addition, the cleaning liquid composition of the present invention can be used not only for cleaning a substrate but also for dissolving organic residues containing Co in all applications.

In particular, it is suitable for removing organic residues and abrasive grains containing Co in a substrate having a Co contact plug and/or Co wiring.

EMBODIMENTS FOR CARRYING OUT INVENTION

Hereinafter, the present invention will be described in detail based on preferred embodiments of the present invention.

First, the cleaning liquid composition and the stock solution composition of the present invention will be described.

The cleaning liquid composition of the present invention is a cleaning liquid composition for cleaning a substrate having a Co contact plug and/or Co wiring, containing one or more reducing agents and water.

The reducing agent used in the present invention is not particularly limited as long as it can change the valence of Co ions, and examples thereof include a five-membered ring or six-membered ring compound in which two or more hydroxyl groups are directly bonded to the ring. These reducing agents may be used alone or in combination of two or more.

The five- or six-membered ring in which two or more hydroxyl groups are directly bonded to the ring may be a saturated or unsaturated five- or six-membered ring, or may be an aromatic five- or six-membered ring. An aromatic five-membered ring or an aromatic six-membered ring in which two or more hydroxyl groups are directly bonded to the ring is preferably used in the present invention, and examples thereof include, but are not limited to, a γ-lactone group and a phenyl group. Furthermore, as long as two or more hydroxyl groups are directly bonded to the ring, a substituent other than the hydroxyl group may also be directly bonded to the ring.

The reducing agent used in the present invention is preferably ascorbic acid, pyrogallol, or methyl gallate, and from the viewpoint of stability in a cleaning liquid, it is particularly preferably pyrogallol or methyl gallate.

In the present invention, the pH of the cleaning liquid composition is preferably less than 12, and more preferably 3 or more and less than 12. From the viewpoint of the cleaning property of organic residues and abrasive grains containing Co, a higher cleaning property can be obtained when the pH is 4 to 9, and a pH of 6 to 9 is particularly preferable.

In addition, the cleaning liquid composition of the present invention may contain a surfactant in order to improve removability of fine particles. The type of surfactant is appropriately selected depending on the fine particles to be removed and the substrate, and without limitation, a polysulfonic acid compound is preferable. Examples of polysulfonic acid compound include naphthalene sulfonic acid-formaldehyde condensate, polystyrene sulfonic acid, lignin sulfonic acid and salts thereof, etc.

The organic residue is, without limitation, a Co-containing organic residue which is a dimer or oligomer of an organometallic complex formed by crosslinking Co with an organic anticorrosive agent such as benzotriazole (BTA) by Co, which is produced by the reaction during CMP process, and is poorly soluble. The organic residues of the substrate which are the target of the cleaning liquid composition according to the present invention may contain a high concentration of Co. In order to dissolve organic residues containing Co in the cleaning liquid, there is a method of breaking the coordination bond between Co and the organic anticorrosive agent by changing the pH of the cleaning liquid to reduce the molecular weight.

Among the organic residues containing Co, examples of the dimer or oligomer of an organometallic complex formed by crosslinking Co with an organic anticorrosive agent such as benzotriazole (BTA) by Co, which is produced by the reaction during CMP process, include, but are not limited to, a Co-benzotriazole (BTA) complex.

The Co-BTA complex refers to a complex of Co and benzotriazole (BTA) formed by crosslinking or the like, and examples thereof include, but are not limited to, a compound wherein an inorganic substance derived from a slurry such as $SiO_2$ is mixed in a Co-BTA complex or Cu-BTA complex.

The substrate having a Co contact plug and/or Co wiring in the present invention is not particularly limited as long as it is a substrate obtained after chemical mechanical polishing (CMP), and examples thereof include a substrate immediately after CMP, and a substrate immediately after the upper insulating film is processed by dry etching after a Co contact plug and/or Co wiring is formed. Of these, the substrate immediately after CMP is preferable.

The chemical mechanical polishing (CMP) in the present invention can be performed in accordance with known chemical mechanical polishing, and examples thereof include, but are not limited to, a polishing method using abrasive grains such as $SiO_2$ and $Al_2O_3$, and an abrasive grain-less polishing method using electrolyzed water. Of these, a polishing method using abrasive grains such as $SiO_2$ and $Al_2O_3$ is preferable.

The stock solution composition of the present invention is the one from which the cleaning liquid composition of the present invention can be obtained by its dilution; and the cleaning liquid composition of the present invention can be obtained by diluting the stock solution composition, for example, but without limitation, 10 times or more, preferably 10 to 1000 times, and more preferably 50 to 200 times; and the dilution may be appropriately determined depending on the composition.

Since the cleaning liquid composition of the present invention is mostly composed of water, when a dilution mixing device is installed in the production line of electronic devices, it is supplied as a stock solution composition, and used by diluting with a diluent including water (said diluent includes those consisting only of ultrapure water) immediately before use; therefore, it also has the advantage of being able to contribute to reduction of transportation cost, reduction of carbon dioxide gas during transportation, and reduction of manufacturing cost at electronic device manufacturers.

The cleaning liquid composition of the present invention can be used, for example, for a substrate having a Co contact plug and/or Co wiring, and it is particularly suitable for use on a substrate having a Co contact plug and/or Co wiring and not having Cu. It is also suitable for use on a substrate after chemical mechanical polishing (CMP), wherein on the substrate surface after CMP, in addition to various wiring and barrier metal materials (Co, Ti-based compounds, Ta-based compounds, Ru, etc.) as well as insulating film materials ($SiO_2$, low-k), fine particles and metal impurities contained in the slurry may be present. The fine particles are mainly alumina, silica, and cerium oxide, etc., and examples of metal impurities include Cu dissolved and redeposited in the slurry during polishing, Fe derived from oxidizing agent in the slurry, and a Co organic metal complex in which a Co preservative and Co contained in the slurry are reacted.

In the present invention, the barrier metal is Co, a Ti-based compound, a Ta-based compound, and Ru, which is used as a layer (barrier metal layer) formed between a contact plug or wiring of a semiconductor substrate and an insulating film to prevent the metal in the contact plug or wiring from diffusing into the insulating film.

The low-k material is a material having a low dielectric constant used for an interlayer insulating film and the like, and examples thereof include, but are not limited to, porous silicon, a silicon-containing organic polymer, and TEOS (tetraethoxysilane). Specific examples include Black Diamond (Applied Materials, Inc.) and Aurora (ASM International).

Next, a method for manufacturing a semiconductor substrate according to the present invention will be described.

The method for manufacturing a semiconductor substrate according to the present invention is a method for manufacturing a semiconductor substrate, which comprises a step of bringing the cleaning liquid composition of the present invention into contact with a substrate having a Co contact plug and/or Co wiring.

In addition, the method for manufacturing a semiconductor substrate according to the present invention is a method for manufacturing a semiconductor substrate, comprising a step of chemical mechanical polishing (CMP) of a substrate having a Co contact plug and/or Co wiring, before the step of bringing the cleaning liquid composition of the present invention into contact with the substrate having a Co contact plug and/or Co wiring.

Examples of the contact step include, but are not limited to, a cleaning step after CMP, and a cleaning step after processing the insulating film of the upper layer of the Co contact plug by dry etching. Examples of the method for contact include, but are not limited to, a single-wafer cleaning method combined with brush scrub, a single-wafer cleaning method in which a cleaning liquid is sprayed from a spray or nozzle, a batch-type spray cleaning method, and a batch-type immersion cleaning method. Of these, a single-wafer cleaning method combined with brush scrub and a single-wafer cleaning method in which a cleaning liquid is sprayed from a spray or nozzle are preferable, and a single-wafer cleaning method combined with brush scrub is particularly preferable.

Examples of the atmosphere for the contact include, but are not limited to, in the air, in a nitrogen atmosphere, and in vacuum. Of these, it is preferably in the air and in a nitrogen atmosphere.

The contact time is appropriately selected according to the purpose and is not particularly limited; in the cases of single-wafer cleaning method combined with brush scrub and single-wafer cleaning method in which a cleaning liquid is sprayed from a spray or nozzle, it is 0.5 to 5 minutes, and in the cases of batch-type spray cleaning method and batch-type immersion cleaning method, it is 0.5 to 30 minutes.

The temperature is appropriately selected according to the purpose and is not particularly limited; in the cases of single-wafer cleaning method combined with brush scrub and single-wafer cleaning method in which a cleaning liquid is sprayed from a spray or nozzle, it is 20° C. to 50° C., and in the cases of batch-type spray cleaning method and batch-type immersion cleaning method, it is 20° C. to 100° C.

The above contact conditions can be appropriately combined according to the purpose.

Examples of the semiconductor substrate include, but are not limited to, silicon, silicon carbide, silicon nitride, gallium arsenide, gallium nitride, gallium phosphide, and indium phosphide. Of these, silicon, silicon carbide, gallium arsenide, and gallium nitride are preferable, and silicon and silicon carbide are particularly preferable.

Next, a method for dissolving an organic residue containing Co according to the present invention will be described.

The method for dissolving an organic residue containing Co of the present invention comprises a step of bringing a cleaning liquid composition containing one or more reducing agents and water and having a pH of 4 to 9 into contact with the organic residue containing Co.

The cleaning liquid composition is not particularly limited as long as it is the above-mentioned one, and the cleaning liquid composition of the present invention described in detail can be used.

The contact method is not particularly limited as long as it is the above-mentioned method.

EXAMPLES

Next, the cleaning liquid composition of the present invention will be described in more detail using examples described below; however, the present invention is not limited thereto.

<Evaluation A: Cleaning Property of Cleaning Liquid Composition (Number of Defects after Co Wafer Cleaning)>
(Preparation of CMP Polishing Liquid)

A slurry using silicon oxide with an average particle size of 70 nm (model number: HS-CB915-B, Hitachi Chemical Company, Ltd.) was diluted 3-fold with ultrapure water (DIW), mixed with hydrogen peroxide solution, to obtain a CMP polishing liquid.
(Preparation of Wafer to be Polished)

A Co substrate having the following configuration was prepared (PVD-Co 2kÅ/Ti/Th-$SiO_2$/Si, Advanced Materials Technology, INC.).
(Wafer Polishing)

Using the above CMP polishing liquid, the wafer to be polished was polished for 30 seconds by a polishing apparatus (CMP polishing apparatus manufactured by Mat, model number: ARW-681MSII). After polishing was completed, the wafer was rinsed with 100 mL of ultrapure water (DIW) for 10 seconds while rotating. Using the cleaning liquid compositions of Tables 1 and 2 (with the exception of Examples 11 and 12, they were adjusted to have a predetermined pH using hydrochloric acid and TMAH. Examples 11 and 12 are post-CMP cleaning liquid compositions containing no reducing agent manufactured by Kanto Chemical Co., Inc., which are an alkaline Cu post-CMP cleaning liquid for Co barrier metal and an acidic Cu post-CMP cleaning liquid for Ta barrier metal, respectively), the wafer was washed for 60 seconds by rolling a brush made from polyvinyl alcohol (manufactured by Aion Co., Ltd.) while rotating the rinsed wafer. The washed wafer was rinsed with 300 mL of ultrapure water (DIW) for 30 seconds while rotating, and further dried at 25° C. for 30 seconds while rotating, to obtain a wafer for measurement.
(Measurement of the Number of Defects on the Wafer Surface)

Figure 1:
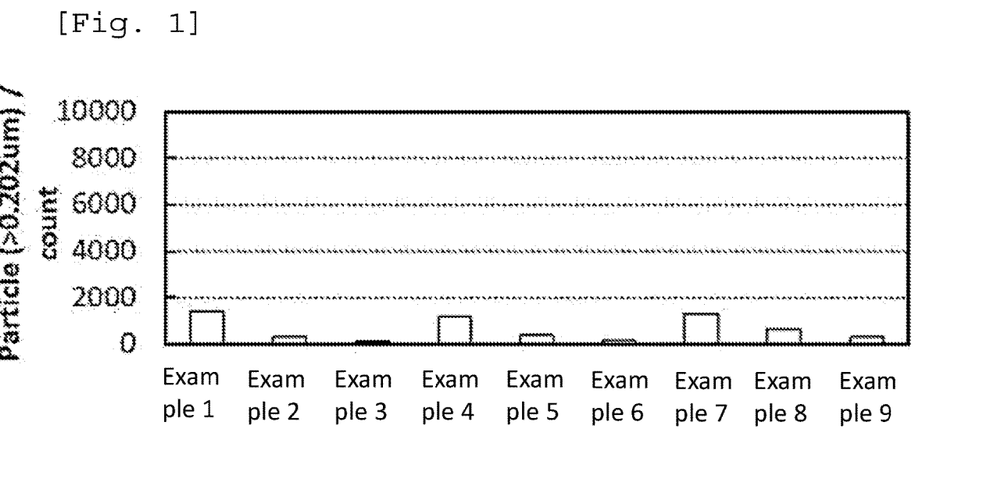
FIG. 1 is a diagram showing the relationship between the type of a reducing agent contained in the cleaning liquid composition and pH of the cleaning liquid composition, and the cleaning property.
Figure 2:
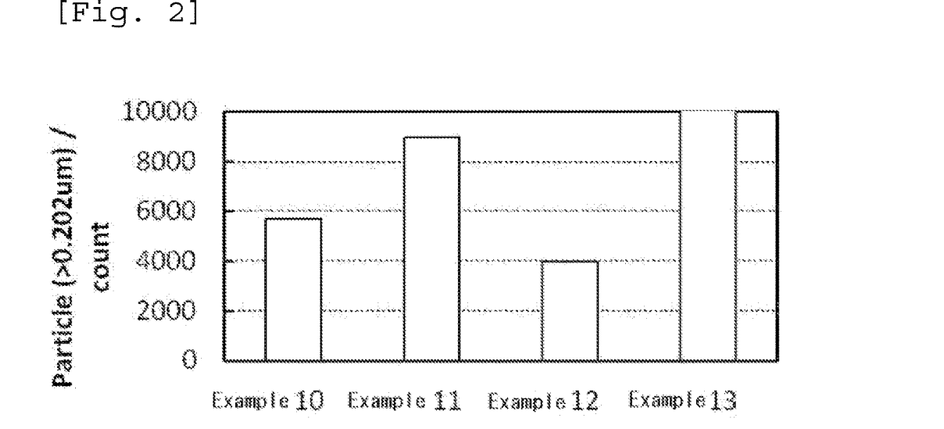
FIG. 2 is a diagram showing the relationship between the presence/absence of a reducing agent, presence/absence of a surfactant and types of other components contained in the cleaning liquid composition, and the cleaning property.

The number of defects on the above wafer surface for measurement was measured by a surface inspection device (Topcon Corporation, model number: WM-10), and the cleaning property of the cleaning liquid composition was evaluated. The evaluation results are shown in FIGS. 1 and 2.
(Results)

As shown in Table 1, Table 2, FIG. 1 and FIG. 2, it was confirmed that, when the pH is the same at 12, the number of defects on the wafer surface cleaned with the cleaning liquid composition containing the reducing agent is smaller than that on the wafer surface cleaned with the cleaning liquid compositions containing no reducing agent (Examples 10, 11 and 13). That is, it was confirmed that the cleaning property of the cleaning liquid composition containing a reducing agent is higher than the cleaning property of the cleaning liquid compositions containing no reducing agent. It was also confirmed that among the cleaning liquid compositions containing the reducing agent, the cleaning properties of the cleaning liquid compositions having pH 4, 6 and 9 were higher than that of the cleaning liquid compositions having pH 12. The cleaning liquids generally used for cleaning Cu (Examples 11 and 12) are not suitable as cleaning liquids for Co, and they had better cleaning performance compared to the cleaning liquids for the cleaning liquid composition of the present invention.

[Table 1]
[Table 2]
<Evaluation B: Removability of Organic Residue of Cleaning liquid composition (Co-BTA removability)>
(Preparation of Co-BTA Substrate)

A Co substrate having the following configuration (PVD-Co 2k Å/Ti/Th-$SiO_2$/Si, Advanced Materials Technology, INC.) was cut into 1.0×1.0 $cm^2$, and these substrates were immersed in a 1% aqueous oxalic acid solution for 10 seconds, rinsed with ultrapure water (DIW) for 1 minute, then immersed in BTA aqueous solution (concentration: 10 mM, pH 8) for 2 minutes, then rinsed again with DIW for 1 minute, and dried by nitrogen blow, to obtain Co-BTA substrates.
(Preparation of Substrate for Evaluation)

A Co substrate having the following configuration (PVD-Co 2kÅ/Ti/Th-$SiO_2$/Si, Advanced Materials Technology, INC.) was cut into 1.0×1.0 $cm^2$, and these substrates were immersed in a 1% aqueous oxalic acid solution for 10 seconds, rinsed with ultrapure water (DIW) for 1 minute, then immersed in BTA aqueous solution (concentration: 10 mM, pH 8) for 2 minutes, then further rinsed with DIW for 1 minute, immersed in each of the cleaning liquid compositions in Tables 3 and 4 (they were adjusted to have a predetermined pH using hydrochloric acid and TMAH) for 1 minute, then rinsed again with DIW for 1 minute, and dried with nitrogen blow, to obtain substrates for evaluation.
(Evaluation of Co-BTA Removability)

The N1s spectrum of each of the above substrates was measured using XPS (X-ray photoelectron spectroscopy, manufactured by JEOL Ltd., model number: JPS-9200). The intensity of the spectrum of the evaluation substrate when the obtained spectrum of the Co-BTA substrate was used as a reference was compared, and the Co-BTA removability was evaluated from the degree of decrease in the intensity.
(Results)

Figure 3:
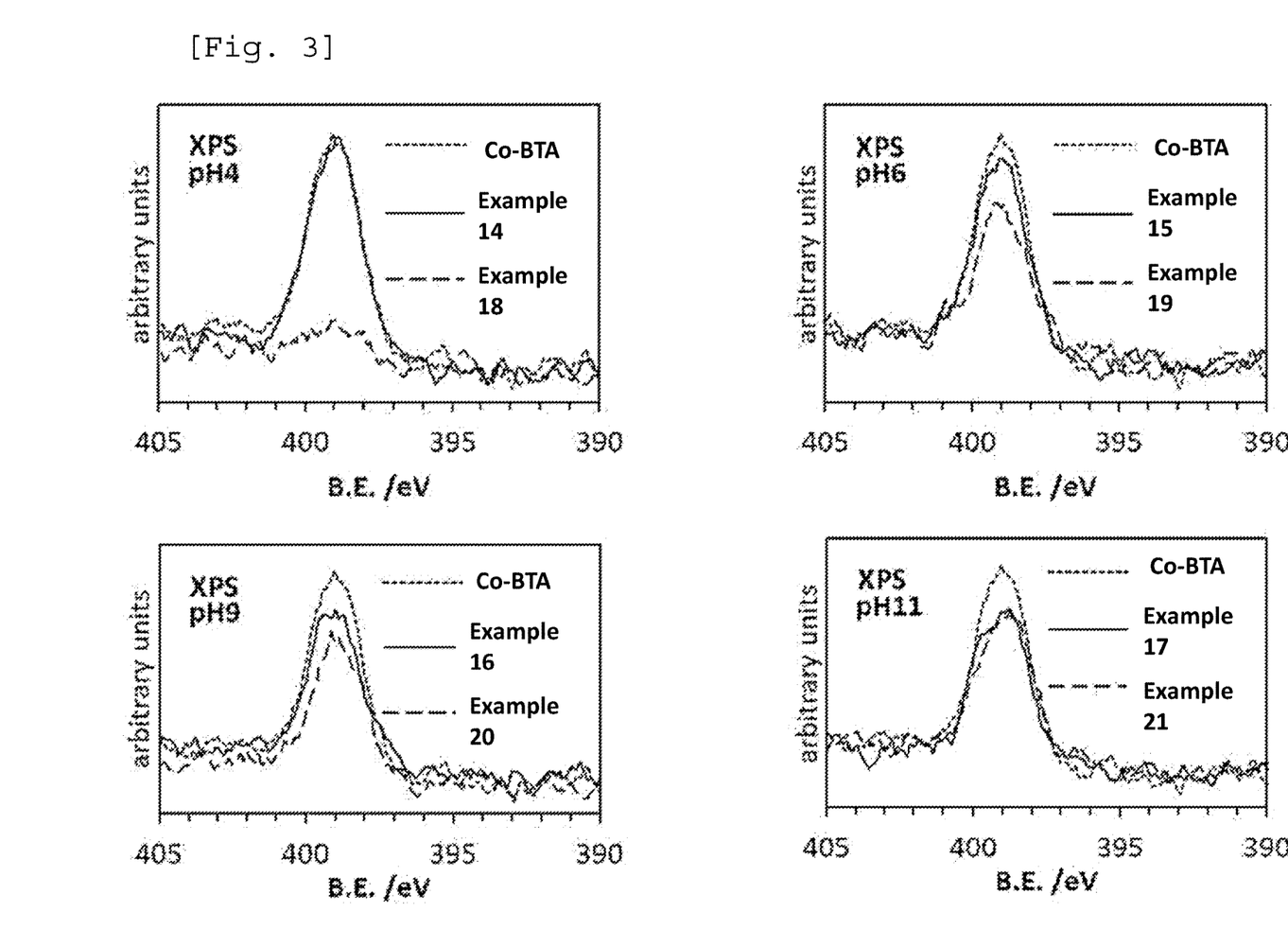
FIG. 3 is a diagram showing the relationship between the presence/absence of a reducing agent and types of other components contained in the cleaning liquid composition, and the XPS spectrum.

It was confirmed that the XPS spectra of Examples 18 to 20 wherein the pH is 4 to 9 shown in FIG. 3 had a reduced spectral intensity as compared with the spectrum of Co-BTA. It is confirmed that the XPS spectra of Examples 14 to 16 containing no reducing agent have a smaller spectral intensity than the Co-BTA spectrum, but the degree of decrease is smaller than that of Examples 18 to 20. From this result, it can be confirmed that the reducing agent is effective in removing Co-BTA (organic residue derived from slurry).
[Table 3]
[Table 4]
<Evaluation C: Measurement of Zeta Potential of Each Particle of Co, $SiO_2$ and SiN in the Cleaning Liquid Composition>

0.05 g of cobalt (SIGMA-ALDRICH) having an average particle size of 50 nm is mixed with 20 ml of ultrapure water (DIW), stirred for 10 minutes using an ultrasonic device to achieve uniform dispersion, and then 20 μL of this solution is collected and added to 50 mL of the cleaning liquid compositions having the composition shown in Table 5 (they were adjusted to have a predetermined pH using hydrochloric acid and TMAH). These solutions were further stirred and made uniform, and zeta potential of cobalt was measured using a zeta potential measuring device (Otsuka Electronics Co., Ltd., model number: ELS-Z).

Zeta potential (mV) was measured for each particle of silicon oxide and silicon nitride in the same manner as for cobalt.

Figure 4:
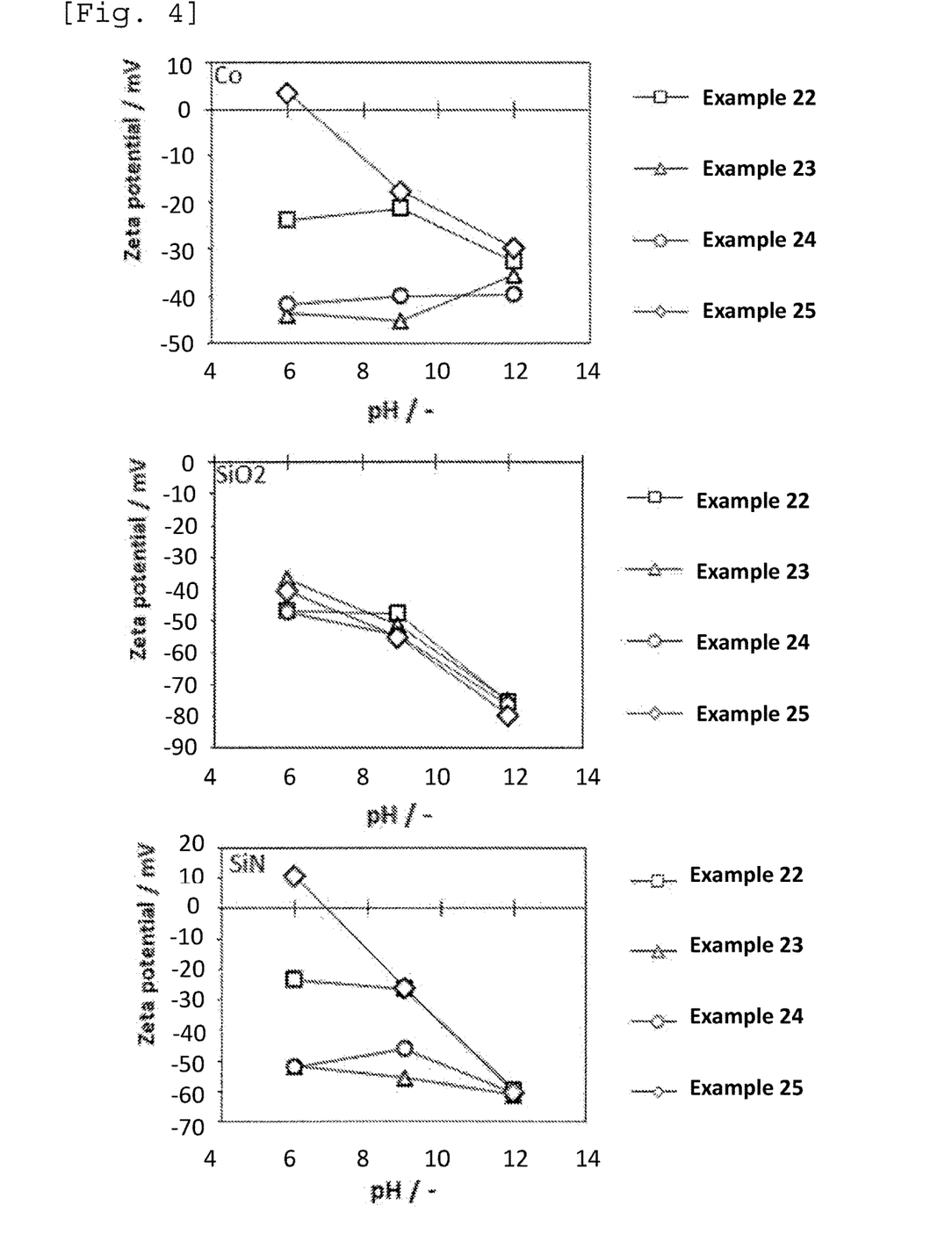
FIG. 4 is a diagram showing the relationship between the presence/absence of a reducing agent, presence/absence of a surfactant contained in the cleaning liquid composition and pH of the cleaning liquid composition, and the zeta potential for each particle of Co, $SiO_2$ and SiN.

The results are shown in Table 5 and FIG. 4.

(Results)

From Table 5 and FIG. 4, regarding cobalt, it was confirmed that the zeta potential in the cleaning liquid compositions containing the reducing agent and/or the surfactant was lower than the zeta potential in the cleaning liquid composition containing neither the reducing agent nor the surfactant. Regarding silicon oxide, no large difference in the zeta potential was observed depending on the composition of the cleaning liquid compositions. Regarding silicon nitride, it was confirmed that the zeta potential in the cleaning liquid compositions containing the reducing agent and/or the surfactant was lower than the zeta potential in the cleaning liquid composition containing neither the reducing agent nor the surfactant.

Furthermore, particularly in the cases of cobalt and silicon nitride, the zeta potential of the cleaning liquid composition containing the reducing agent in the acidic region exceeds 0, whereas the zeta potential of the cleaning liquid compositions containing the reducing agent and/or the surfactant showed a large negative zeta potential in a wide pH range of pH 6-12. Therefore, a negative zeta potential is also shown in objects to be cleaned containing cobalt wiring and silicon nitride. Since the silica abrasive grains contained in a cobalt-polishing slurry generally have a negative zeta potential, by using the present cleaning liquid composition containing a reducing agent and/or a surfactant, it is expected that the lift-off effect of silica abrasive grains due to repulsive action caused by the negative zeta potential between the silica abrasive grains and the object to be cleaned is enhanced, and at the same time, reattachment of the silica abrasive grains to the cleaning object is prevented, which contributes to the improvement of cleaning performance.

[Table 5]

TABLE 1

| | Cleaning liquid | | | Cleaning | Number of defects | | | Total number |
| | Reducing agent | Surfactant | pH | time (sec.) | 0.202 um | 0.309 um | 1.005 um | (>0.202 um) |
|---|---|---|---|---|---|---|---|---|
| Ex. 1 | Ascorbic acid, 5 mM | IONET D2 100 ppm | 4 | 60 | 822 | 509 | 77 | 1408 |
| Ex. 2 | Ascorbic acid, 5 mM | IONET D2 100 ppm | 6 | 60 | 235 | 55 | 9 | 299 |
| Ex. 3 | Ascorbic acid, 5 mM | IONET D2 100 ppm | 9 | 60 | 105 | 21 | 3 | 129 |
| Ex. 4 | pyrogallol 5 mM | IONET D2 100 ppm | 4 | 60 | 1009 | 138 | 16 | 1163 |
| Ex. 5 | pyrogallol 5 mM | IONET D2 100 ppm | 6 | 60 | 336 | 45 | 7 | 388 |
| Ex. 6 | pyrogallol 5 mM | IONET D2 100 ppm | 9 | 60 | 141 | 28 | 4 | 173 |
| Ex. 7 | methyl gallate, 5 mM | IONET D2 100 ppm | 4 | 60 | 882 | 422 | 23 | 1327 |
| Ex. 8 | methyl gallate, 5 mM | IONET D2 100 ppm | 6 | 60 | 500 | 143 | 13 | 656 |
| Ex. 9 | methyl gallate, 5 mM | IONET D2 100 ppm | 9 | 60 | 247 | 75 | 8 | 330 |

TABLE 2

| | Cleaning liquid | | | | Cleaning | Number of defects | | | Total number |
| | Reducing agent | Surfactant | Other component | pH | time (s) | 0.202 um | 0.309 um | 1.005 um | (>0.202 um) |
|---|---|---|---|---|---|---|---|---|---|
| Ex. 10 | Ascorbic acid, 5 mM | IONET D2 100 ppm | — | 12 | 60 | 4874 | 735 | 94 | 5703 |
| Ex. 11 | — | — | Cu/Co cleaning liquid (B226 100) | 12 | 60 | 8162 | 725 | 101 | 8988 |
| Ex. 12 | — | — | Cu cleaning liquid (M02 100) | 2 | 60 | 3352 | 509 | 101 | 3962 |
| Ex. 13 | — | — | TMAH aqueous solution | 12 | 60 | — | — | — | Unmeasurable due to excess |

TABLE 3

| | pH | Cleaning liquid Reducing agent | Other component |
|---|---|---|---|
| Ex. 14 | 4 | — | Hydrochloric acid |
| Ex. 15 | 6 | — | TMAH |
| Ex. 16 | 9 | — | TMAH |
| Ex. 17 | 11 | — | TMAH |

TABLE 4

| | pH | Cleaning liquid Reducing agent | Other component |
|---|---|---|---|
| Ex. 18 | 4 | Ascorbic acid, 5 mM | TMAH |
| Ex. 19 | 6 | Ascorbic acid, 5 mM | TMAH |
| Ex. 20 | 9 | Ascorbic acid, 5 mM | TMAH |
| Ex. 21 | 11 | Ascorbic acid, 5 mM | TMAH |

TABLE 5

| Cleaning liquid Reducing agent | Surfactant | Other component | Co pH 6 | Co pH 9 | Co pH 12 | SiO2 pH 6 | SiO2 pH 9 | SiO2 pH 12 | SiN pH 6 | SiN pH 9 | SiN pH 12 |
|---|---|---|---|---|---|---|---|---|---|---|---|
| Ex. 22 Ascorbic acid 5 mM | — | hydrochloric acid, TMAH | −23.9 | −21.2 | −32.7 | −46.6 | −47.6 | −75.7 | −23.4 | −25.0 | −59.3 |
| Ex. 23 — | IONET D2 100 ppm | hydrochloric acid, TMAH | −43.8 | −45.1 | −35.3 | −36.7 | −51.2 | −75.0 | −51.5 | −55.3 | −60.8 |
| Ex. 24 Ascorbic acid 5 mM | IONET D2 100 ppm | hydrochloric acid, TMAH | −42.0 | −39.9 | −39.7 | −47.2 | −54.3 | −75.4 | −51.9 | −45.7 | −60.5 |
| Ex. 25 — | — | hydrochloric acid, TMAH | 3.4 | −17.7 | −29.7 | −40.3 | −54.9 | −79.5 | 11.0 | −25.7 | −60.1 |

The invention claimed is:

1. A method for manufacturing a semiconductor substrate, comprising a step of bringing a cleaning liquid composition into contact with (a) the substrate having a Co contact plug and/or Co wiring or (b) the substrate having Co and not having Cu,
wherein the cleaning liquid composition contains one or more reducing agents and water, and one or more polysulfonic acid compounds as a surfactant, and
when the cleaning liquid composition is brought into contact with (b) the substrate having Co and not having Cu, a pH of the cleaning liquid composition is 3 or more and less than 12.

2. The method for manufacturing a semiconductor substrate of claim 1, comprising a step of chemical mechanical polishing (CMP) of (a) the substrate having a Co contact plug and/or Co wiring or (b) the substrate having Co and not having Cu, before the step of bringing the cleaning liquid composition into contact with (a) the substrate having a Co contact plug and/or Co wiring or (b) the substrate having Co and not having Cu.

3. The method for manufacturing a semiconductor substrate of claim 1, wherein the step of bringing the cleaning liquid composition into contact with (a) the substrate having a Co contact plug and/or Co wiring or (b) the substrate having Co and not having Cu is a step of cleaning (a) the substrate having a Co contact plug and/or Co wiring or (b) the substrate having Co and not having Cu.

4. The method for manufacturing a semiconductor substrate of claim 1, wherein polysulfonic acid is selected from the group consisting of naphthalene sulfonic acid-formaldehyde condensate, polystyrene sulfonic acid, lignin sulfonic acid, and salts thereof.

5. The method for manufacturing a semiconductor substrate of claim 1, wherein the reducing agent contains one or more selected from the group consisting of five-membered ring or six-membered ring compounds in which two or more hydroxyl groups are directly bonded to the ring.

6. The method for manufacturing a semiconductor substrate of claim 5, wherein the reducing agent is one or more selected from the group consisting of ascorbic acid, pyrogallol and methyl gallate.

7. The method for manufacturing a semiconductor substrate of claim 1, wherein in item (b), the substrate having Co is the substrate having a Co contact plug and/or Co wiring.

* * * * *